United States Patent
Ward et al.

(10) Patent No.: US 6,769,288 B2
(45) Date of Patent: Aug. 3, 2004

(54) METHOD AND ASSEMBLY FOR DETECTING A LEAK IN A PLASMA SYSTEM

(75) Inventors: Pamela Peardon Denise Ward, Rio Rancho, NM (US); Joel O'Don Stevenson, Albuquerque, NM (US); Michael Lane Smith, Jr., Albuquerque, NM (US)

(73) Assignee: Peak Sensor Systems LLC, Albuquerque, NM (US)

( * ) Notice: Subject to any disclaimer, the term of this patent is extended or adjusted under 35 U.S.C. 154(b) by 0 days.

(21) Appl. No.: 10/286,308

(22) Filed: Nov. 1, 2002

(65) Prior Publication Data

US 2004/0083797 A1 May 6, 2004

(51) Int. Cl.[7] .......................... G01M 3/04; G01M 3/20; G01M 3/32
(52) U.S. Cl. ............................ 73/40.7; 73/40; 73/49.2; 73/49.3
(58) Field of Search .......................... 73/40, 40.7, 49.2, 73/49.3

(56) References Cited

U.S. PATENT DOCUMENTS

| | | | |
|---|---|---|---|
| 4,459,844 A | 7/1984 | Burkhart | .................... 73/40.7 |
| 4,489,239 A | 12/1984 | Grant et al. | |
| 4,776,207 A | 10/1988 | Holme | ........................ 73/40.7 |
| 5,326,975 A | 7/1994 | Barna | .......................... 250/372 |
| 5,551,285 A | 9/1996 | Gannon et al. | |
| 5,711,843 A * | 1/1998 | Jahns | ...................... 156/345.24 |
| 5,789,754 A | 8/1998 | Cathey et al. | ............... 250/372 |
| 5,889,199 A | 3/1999 | Wong et al. | |
| 6,154,284 A | 11/2000 | McAndrew et al. | |
| 6,192,287 B1 | 2/2001 | Solomon et al. | ............ 700/110 |
| 2003/0046976 A1 * | 3/2003 | Hanazaki et al. | ........... 73/23.21 |

* cited by examiner

Primary Examiner—Daniel S. Larkin
(74) Attorney, Agent, or Firm—Marsh Fischmann & Breyfogle LLP

(57) ABSTRACT

The present invention relates to a method and assembly for leak detection in a plasma system. The invention can accomplish not only leak detection, but also leak location while maintaining a plasma within the plasma system. Leak detection for the invention is achieved by obtaining spectral data of the plasma at one or more times while maintaining the plasma within the plasma system and comparing the same to predetermined spectral data of air. Upon a determination that air is present within the plasma system, one or more external surfaces of the plasma system are exposed to a test gas and the spectral data of the plasma is analyzed after each exposure to determine if the test gas is present in the system. If the test gas is present, a determination can be made that the particular external surface to which the test gas was applied is a leak location.

33 Claims, 11 Drawing Sheets

METHOD AND ASSEMBLY FOR DETECTING A LEAK IN A PLASMA SYSTEM

FIELD OF THE INVENTION

The present invention generally relates to the field of plasma processes and, more particularly, to detecting leaks in systems utilized to perform such plasma processes.

BACKGROUND OF THE INVENTION

Plasma is used in various types of industrial-type processes in the semiconductor and printed wiring board industries, as well as in various other industries such as in the medical equipment and automotive industries. One common use of plasma is for etching away materials in an isolated or controlled environment. Various types of materials may be etched by one or more plasmas, including glasses, silicon or other substrate materials, organics such as photoresist, waxes, plastics, rubbers, biological agents, and vegetable matter, and metals such as copper, aluminum, titanium, tungsten, and gold. Plasma is also utilized for depositing materials such as organics and metals onto an appropriate surface by various techniques, such as via chemical vapor deposition. Sputtering operations may also utilize plasmas to generate ions which sputter away material from a source (e.g., metals, organics) and deposit these materials onto a target such as a substrate. Surface modification operations also use plasmas, including operations such as surface cleaning, surface activation, surface passivation, surface roughening, surface smoothing, micromachining, hardening, and patterning.

Plasma processes are typically conducted in a highly controlled environment, such as a sealed processing chamber. It is thereby desirable to avoid an introduction of impurities (e.g., air and/or water vapor) into the plasma processing system since any such impurity may have an adverse effect on one or more aspects of the plasma process. By way of example, impurities may enter a plasma processing system through one or more leaky seals. One conventional way in which at least the potential for leaks is detected is by monitoring pressure within the processing chamber. In the event that the system will not hold a vacuum or pressure at a desired level, an assumption may be made that this is due to an existence of one or more leaks. How the location(s) of these leaks is identified is typically quite cumbersome. Upon discovering that the system will not hold a vacuum or pressure at a desired level, a chamber of the plasma processing system is shut down (i.e., taken off line). The plasma processing system is subsequently "opened" to allow leak detection equipment (e.g., mass spectrometer) to be incorporated in an appropriate flow path. Thereafter, the system is once again sealed and helium is applied on one or more seals on the exterior of the system to detect a presence of helium within the corresponding chamber of the plasma processing system via the installed leak detection equipment. While such a leak detection protocol may enable leak detection, shut down of the system (sometimes accompanied by evacuation of the plasma from the system) typically results in fiscal and/or temporal inefficiency. It would thus be desirable to provide a leak detection system that increases the potential for minimizing and/or alleviating one or more of the above-mentioned drawbacks associated with conventional leak detection systems.

SUMMARY OF THE INVENTION

Accordingly, the present invention is generally directed to detection of leaks in a plasma system. Moreover, the present invention allows for accomplishing such leak detection while maintaining a plasma within the plasma system and optionally while a product (e.g., a wafer) is positioned within the corresponding plasma chamber. Herein, "maintaining" a plasma in the plasma system refers to avoiding intentional removal of the plasma from the plasma system. In other words, the plasma is generally not removed from the plasma system prior to leak detection. As another potential benefit, the present invention may be a portable (i.e., handheld) assembly for conducting such leak detection. Accordingly, when analysis of the plasma is desired to check for the presence of a leak, this portable device may simply be pointed at and looking through a window of the plasma system. Herein, "portable," "portability," and the like generally refer to a characteristic of the associated leak detection assembly which enables the same to be freely moved and/or carried about by a potential user. In other words, a potential user (e.g., engineer, operator, technician, or the like) may be able to carry a leak detection assembly of the invention with him/her in a tool box or on his/her clothing (e.g., on a tool belt or supported by a shirt/pant pocket).

A first aspect of the invention is generally embodied in a method of detecting a leak in a plasma system. This method of the first aspect generally includes maintaining a plasma in the plasma system and obtaining optical emissions spectral data of the plasma within the plasma system at least at a plurality of times while maintaining the plasma in the plasma system. The method also includes monitoring for an existence of air in the plasma while both maintaining the plasma in the plasma system and obtaining optical emissions spectral data of the same. If air is identified in the plasma, a first external surface of the plasma system is exposed to a test gas while maintaining the plasma in the plasma system. Optical emissions spectral data of the plasma can then be analyzed for the presence of the test gas (e.g., helium, neon, and/or argon) to determine if the first external surface to which the test gas was exposed is the location of the leak.

Various refinements exist of the features noted in relation to the subject first aspect of the present invention as well. Further features may also be incorporated in the subject first aspect of the present invention as well. These refinements and additional features may exist individually or in any combination. For example, monitoring the plasma for the existence of air may include comparing the optical emissions spectral data of the plasma with predetermined optical emissions spectral data of air. Moreover, the optical emissions spectral data indicative of air may be acquired and stored on a computer-readable storage medium (e.g., E-PROM, a floppy disk, compact disk, hard disk) to be utilized during monitoring the plasma for the existence of air.

Some embodiments in the case of the first aspect may include exposing a second external surface (i.e., different from the first external surface) of the plasma system to the test gas upon failing to identify a presence of the test gas in the plasma after the first external surface was exposed to the test gas. In other words, if the test gas is not detected within the plasma system within a reasonable time after exposing the first external surface to the test gas, the first aspect may include exposing the second external surface of the plasma system to the test gas. Upon exposure of the second external surface of the plasma system to the test gas, the plasma is once again analyzed to determine if the test gas is present therein. This may be repeated until the leak has been located or until all external surfaces have been tested in this general manner. In some embodiments, any product (e.g., a wafer or chip precursor) originally disposed within the plasma system may be removed prior to exposing any external surfaces of the plasma system to the test gas. However, other embodiments provide for any product originally disposed within the plasma system to remain there while the external surface(s) is exposed to the test gas. In other words, in these other embodiments, a product may be located within the plasma system, and a plasma process may be running while the external surface(s) is exposed to the test gas for leak detection purposes.

In the case of the first aspect, a leak detector may be utilized for comparing the optical emissions spectral data of the plasma with spectral data of air stored on the leak detector and/or for comparing the optical emissions spectral data of the plasma with spectral data of the test gas stored on the leak detector. So, the leak detector may operate in a first mode to detect the presence of air within the plasma and a second mode (different from the first mode) to detect the presence of the test gas within the plasma. By way of example, the leak detector of this first aspect may have a switch on it. When the switch is in a first position, the leak detector may compare the optical emissions spectral data of the plasma with a spectral pattern of air stored on the leak detector. Likewise, when the switch is in a second position, the leak detector of this first aspect may compare the optical emissions spectral data of the plasma with a spectral pattern of the test gas stored on the leak detector. Various features discussed above in relation to the first aspect of the present invention may be incorporated into any of the following aspects of the present invention as well, and in the manner noted above.

A second aspect of the invention is also embodied in a method of detecting a leak in a plasma system. The method of this second aspect of the present invention includes maintaining a plasma in the plasma system, and obtaining optical emissions spectral data of the plasma at least at a plurality of times while the plasma is maintained in the plasma system. This second aspect further includes comparing the optical emissions spectral data of the plasma with a predetermined spectral pattern indicative of optical emissions spectral data of air. If the comparison results in a determination that the optical emissions spectral data of the plasma includes a pattern that matches the predetermined spectral pattern of air, an assumption can be made that the plasma system has a leak. Herein, "matches" refers to the pattern resembling or having similar characteristics (e.g., the presence of peaks at similar wavelengths) of the predetermined spectral pattern of air. To discover the location of the leak, an external seal of the plasma system is exposed to a test gas and the optical emissions spectral data of the plasma is analyzed for a presence of the test gas. If the test gas is determined to be present in the plasma, an assumption can be made that the external seal that was exposed to the test gas is where the leak can be found.

Various refinements exist of the features noted in relation to the subject second aspect of the present invention. Further features may also be incorporated in the subject second aspect as well. These refinements and additional features may exist individually or in any combination. For example, the predetermined spectral pattern of air utilized by this second aspect may include a plurality of, and even substantially all, wavelengths between 250 nm and 790 nm. The second aspect may include determining if the optical emissions spectral data of the plasma includes each spectral peak associated with air, or at least 33% of all spectral peaks associated with air. Various features discussed above in relation to the second aspect of the present invention may be incorporated into any of the other aspects of the present invention as well, and in the manner noted above.

A third aspect of the present invention is also embodied in a method of detecting a leak in a plasma system. This third aspect includes maintaining a plasma in the plasma system and obtaining optical emissions spectral data at least at a plurality of times while the plasma is maintained in the plasma system. Moreover, this third aspect includes both identifying an existence of an air leak and determining a location of the leak from the obtained optical emissions spectral data. Various features discussed above in relation to the first and second aspects of the present invention may be incorporated, individually or in any combination, into this third aspect as well, and in the manner noted herein.

A fourth aspect of the present invention is embodied in a leak detection assembly for use in combination with a plasma system. This leak detection assembly includes a spectrometer, and a memory including optical emissions data of air and optical emissions data of a test gas. The leak detection assembly also includes a logic circuit or the like capable of comparing the optical emissions data of the memory with optical emissions data obtained from the plasma system by the spectrometer. In addition, this leak detection assembly generally is equipped with a switch. When this switch of the leak detection assembly is in a first position, the logic circuit is capable of comparing the optical emissions data of air with the optical emissions data obtained from the plasma system by the spectrometer. Likewise, when this switch is in a second position, the logic circuit is capable of comparing the optical emissions data of the test gas with the optical emissions data obtained from the plasma system by the spectrometer.

Various refinements exist of the features noted in relation to the subject fourth aspect of the present invention. Further features may also be incorporated in this fourth aspect of the present invention as well. These refinements and additional features may exist individually or in any combination. Some embodiments of this fourth aspect include a housing. The optical emissions spectrometer, the memory, and the logic circuit of the leak detection assembly may be substantially positioned within this housing. To quantify the portability of some embodiments of the fourth aspect, this housing may have a volume (i.e., three-dimensional space enclosed within or occupied by the housing) of no more than about 192 cubic inches ($in^3$) in one embodiment, and no more than about 40 $in^3$ in another embodiment. As another avenue of quantifying the portability of some embodiments of the fourth aspect, the leak detection assembly may exhibit a weight of no more than about five pounds in one embodiment, and no more than about one pound in another embodiment. So, some embodiments of this fourth aspect may be handheld, or capable of being entirely supported by the hands of a user. However, other embodiments of this fourth aspect may exhibit leak detection assemblies having one or both a weight and a volume greater than that disclosed above.

In the case of this fourth aspect of the present invention, a variety of other components may be included in the leak detection assembly. For example, the leak detection assembly may be equipped with an indicator for providing an indication that the leak detection assembly has detected air and/or the test gas within the plasma system. This indicator may be designed to emit a first signal upon detection of air and to emit a second signal (different than that of the first) upon detection of the test gas. Any mechanism(s) capable of emitting one or more appropriate signals such as sound, light, and/or vibrations may be suitable as the indicator. As another potential component, a trigger may be included in the leak detection assembly, wherein activation (e.g., pressing, squeezing, pulling, flipping, and the like) of this trigger may initiate collection and/or analysis of the optical emissions data. As still yet another potential component, the leak detection assembly may include a mounting structure configured to enable the same to be mounted on the plasma system. In other words, this mounting structure generally allows the leak detection assembly to be releasably attached to the plasma system, for example, to allow optical emissions spectral data to be obtained through a viewing window (or the like) of the plasma system.

Yet a fifth aspect of the present invention is embodied in a leak detection assembly having a first mechanism for collecting optical emissions data of a plasma, a memory that includes optical emissions data of both air and a leak detection gas, and a second mechanism for comparing the optical emissions data of the plasma with both the optical emissions data of air and the optical emissions data of the leak detection gas. Various features discussed above in relation to any of the aspects of the present invention may be incorporated, individually or in any combination, into this or any other aspect of the invention, and in the manner disclosed herein.

DETAILED DESCRIPTION

Figure 1:
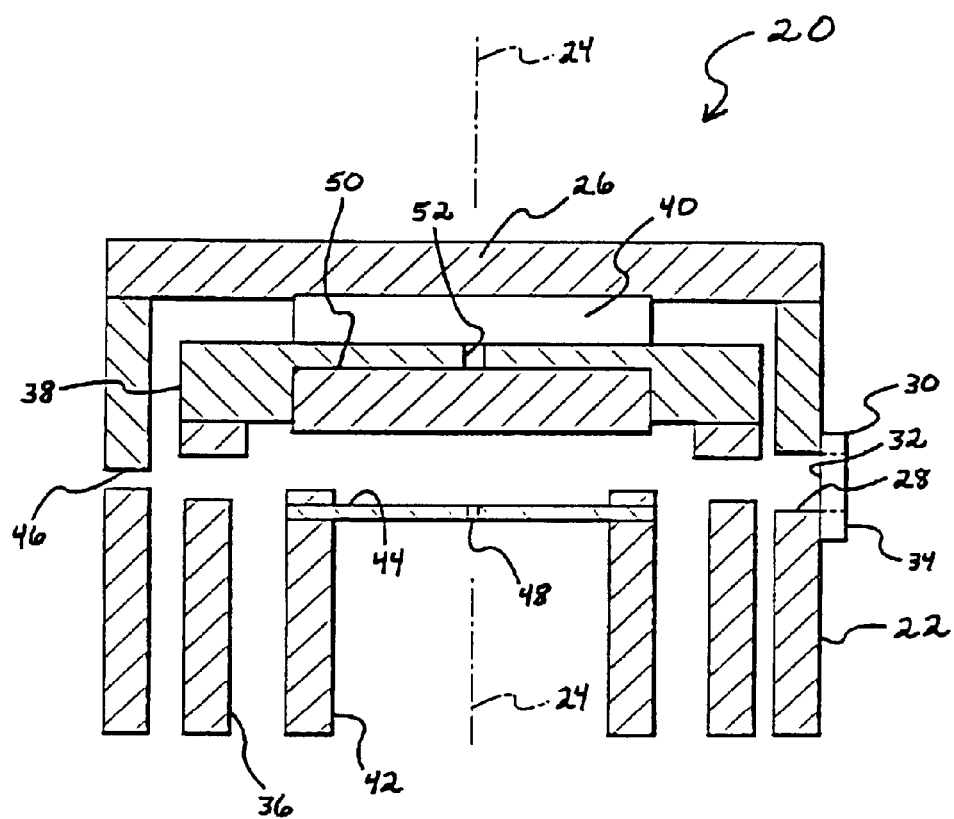
FIG. 1 is a cross-sectional view of one embodiment of a plasma processing chamber which may be incorporated in a plasma system.

Semiconductor devices (including integrated circuit chips as well as microelectro-mechanical (MEM) devices) may be formed from wafers processed by a plasma system. A plasma system generally includes (among other components) one or more processing chambers wherein the wafer(s) is placed for processing. Plasma within the chamber(s) processes the enclosed wafer(s) in some manner (e.g., etching to remove a predetermined layer of material or depositing materials, such as by chemical vapor deposition or sputtering). While one embodiment of a processing chamber of a plasma system is illustrated in FIG. 1, the herein disclosed leak detection assembly (FIGS. 3–4) and protocol (FIGS. 5–6) may be utilized with other types/configurations of processing chambers/plasma systems as well, including, but not limited to, those disclosed in U.S. Pat. No. 5,614,055 to Fairbairn et al., issued Mar. 25, 1997, and entitled "HIGH DENSITY PLASMA CVD AND ETCHING REACTOR", and U.S. Pat. No. 5,641,375 to Nitescu et al., issued Jun. 24, 1997, and entitled "PLASMA ETCHING REACTOR WITH SURFACE PROTECTION MEANS AGAINST EROSION OF WALLS", both patents of which are incorporated by reference in their entirety herein.

The processing chamber 20 of FIG. 1 is generally adapted for performing one or more plasma etching operations on one or more wafers (not shown) when disposed therein. The processing chamber 20 includes chamber sidewalls 22 which are disposed about a central, longitudinal axis 24 of the chamber 20. Access to the processing chamber 20 may be provided by a chamber cover 26 which is interconnected with the chamber sidewalls 22 in such a manner that at least in certain instances, at least a portion of the chamber cover 26 may be moved away from the chamber sidewalls 22. In the illustrated embodiment, the chamber cover 26 is removed only to gain access to the interior of the processing chamber 20 for maintenance, cleaning, or both. A window port 28 extends through a portion of the chamber sidewall 22 and is aligned with a transparent window 30. The window 30 includes an inner surface 32 and an outer surface 34, and provides a way for the plasma to be viewed exteriorly of the processing chamber 20 and further to provide a mechanism for obtaining optical emissions data on the plasma being run on the wafer(s) within the chamber 20.

Protection of the chamber sidewalls 22 and the chamber cover 26 from the effects of plasma processes being conducted within the chamber 20 is provided by a bell jar 36 and a bell roof 38 which are each formed from transparent, dielectric materials (e.g., quartz, sapphire). The bell jar 36 is spaced radially inward (e.g., in the direction of the central, longitudinal axis 24 of the chamber 20) from the inner surface of the chamber sidewalls 22. The bell roof 38 is disposed above the bell jar 36 and is axially movable in a direction which is at least substantially parallel with the central, longitudinal axis 24 of the chamber 20 through interconnection with an elevator 40. Movement of the elevator 40 may be desirable for one or more purposes. For instance, this movement may be used to change the spacing between a showerhead 50 and a wafer pedestal 42/wafer platform 44 which in one embodiment are the electrodes or "plasma generator" for the chamber 20.

The wafer pedestal 42 is disposed radially inwardly of the bell jar 36 in spaced relation therewith, and the wafer platform 44 is disposed on top of the wafer pedestal 42. In one embodiment, both the wafer pedestal 42 and wafer platform 44 are formed from silicon-based materials since the wafers are also commonly formed from silicon-based materials. The wafer is generally introduced into the processing chamber 20 through a wafer access 46 which extends through the chamber sidewall 22, and is disposed in a flat orientation on the upper surface of the wafer platform 44. Various mechanisms may be appropriate for retaining the wafer on the wafer platform 44 during the running of the plasma process on the wafer in the chamber 20, such as by drawing a vacuum through a vacuum port 48 which is formed on the wafer platform 44 or by using electrostatic charges (not shown). Generally, a vacuum is generated within the processing chamber 20 before the plasma process is initiated.

The showerhead 50 is interconnected with the elevator 40 such that it is axially movable therewith, and in one embodiment is also formed from a silicon-based material for the above-noted reasoning. The showerhead 50 includes one or more apertures (not shown) for the purpose of dispersing feed gases within the processing chamber 20 in a manner to define a desired gas flow pattern for the plasma. Gases are provided to the showerhead 50 through a gas inlet port 52 formed in the bell roof 38. With appropriate gases being contained within the processing chamber 20 and under other appropriate conditions (e.g., pressure, temperature, flow rate), an appropriate voltage may be applied to one or more of the wafer pedestal 42, the wafer platform 44, and the showerhead 50 to ignite or "light" the plasma within the chamber 20 above the wafer platform 44. The wafer pedestal 42 and wafer platform 44, as well as the showerhead 50, may thereby also function as electrodes in the illustrated embodiment as noted. The electrical field generated by these electrodes may also function to effectively confine the plasma to the space between the electrodes.

Figure 2:
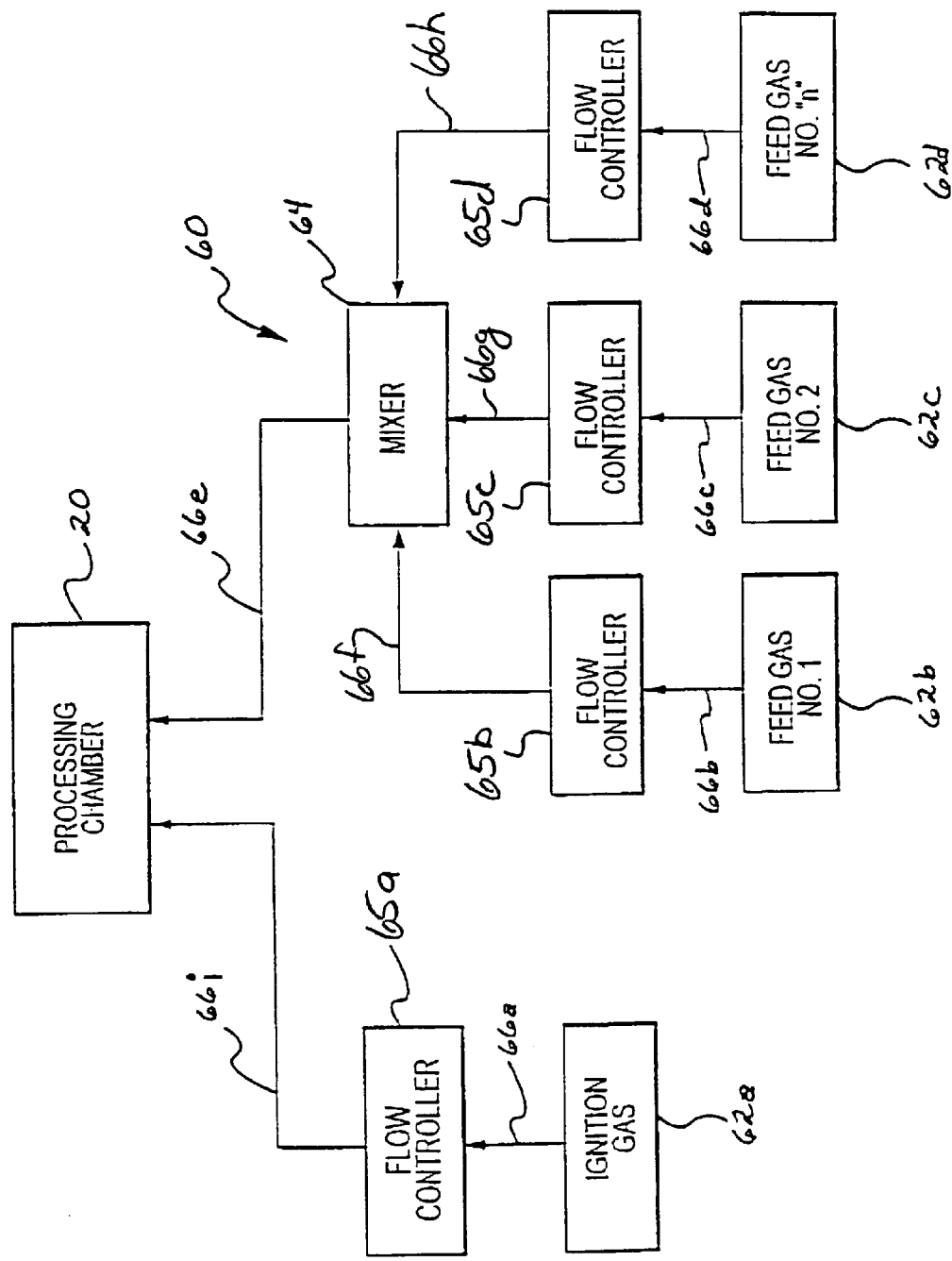
FIG. 2 is a schematic view of one embodiment of a gas delivery system for the processing chamber of FIG. 1.

FIG. 2 illustrates one embodiment of a gas delivery system 60 which may be used to provide gases to the processing chamber 20 of FIG. 41 for a given plasma process operation. Other systems may be utilized as well. The gas delivery system 60 includes a plurality of storage tanks 62a–d each of which is fluidly interconnected with the processing chamber 20 either directly or indirectly. Storage tanks 62b–d are available for containing one or more types of feed gases which will define the gas composition of the plasma within the processing chamber 20. Each storage tank 62b–d is fluidly interconnected with a mixer 64 by gas lines 66b–d, respectively, flow controllers 65b–d, respectively, and gas lines 66f–h, respectively. The feed gases may be appropriately mixed in the mixer 64 prior to being provided to the processing chamber 20 through the showerhead 50 via the gas line 66e. Mixing of the feed gases could also occur in a manifold (not shown) into which each of the feed gases would separately flow and which could be contained within or be part of the processing chamber 20. The manifold would then interface with the gas inlet port 52, and this type of manifold may also be used in combination with the mixer 64. In some cases the composition of the feed gases provided to the processing chamber 20 to define the plasma may be difficult to ignite. This situation is remedied by including an appropriate gas in the storage tank 62a.

A gas composition which is more readily ignitable than the composition of the feed gases is contained within the storage tank 62a. Ignition of the plasma would then be affected by directing a flow of the ignition gas from the storage tank 62a through a gas line 66a, through a flow controller 65a through a gas line 66i, and into the processing chamber 20, along with a flow of the desired feed gases from the storage tanks 62b–d, and using the ignition of the ignition gas to then ignite the feed gases to generate the plasma. The previous descriptions of the processing chamber of FIG. 1 and the gas delivery system of FIG. 2 are for illustrative purposes only. As previously stated, the following leak detection assembly of FIGS. 3–4 and the following leak detection protocol of FIGS. 5–6 may be utilized for detection of a leak in any appropriate plasma system.

Figure 3:
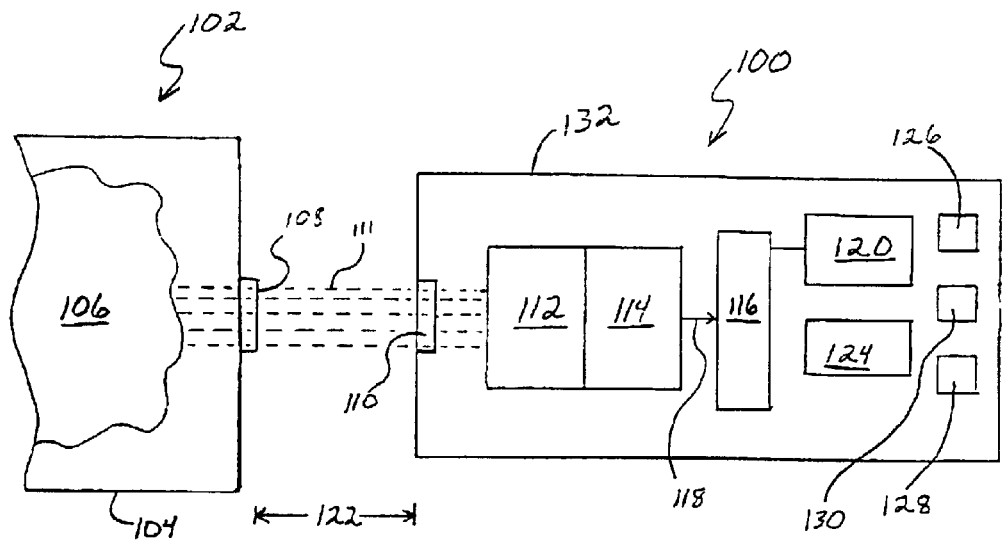
FIG. 3 is a side view of one embodiment of a leak detection assembly and one embodiment of a plasma system.

FIG. 3 illustrates one embodiment of a leak detection assembly 100 positioned near a plasma system 102. As described above, the plasma system 102 has a processing chamber 104, which generally confines a plasma 106 therein, and a window 108 that provides a way for the plasma 106 to be viewed exteriorly of the plasma system and/or that provides a mechanism for obtaining spectral data of the plasma 106 disposed within the system 102.

The leak detection assembly 100 of FIG. 3 is generally utilized to collect and analyze spectral data pertaining to the composition of the plasma 106. This leak detection assembly 100 includes a lens or optic 110, which enables electromagnetic radiation 111 emitted from the plasma 106 to enter the leak detection assembly 100. The electromagnetic radiation 111 that enters the leak detection assembly 100 via the lens 110 is generally directed toward a spectrometer (e.g., optical emissions spectrometer) 112 that is interconnected with a charge coupled device (CCD) array 114. The spectrometer 112 generally collects the electromagnetic radiation 111 emitted from the plasma 106 and conveys the same to the CCD array 114, which generally functions to convert the electromagnetic radiation 111 to electrical signals indicative of the collected electromagnetic radiation 111. The electrical signals generated by the CCD array 114 are conveyed to a logic circuit 116 via an appropriate electrical connection 118. A memory 120 generally including some sort of computer-readable storage medium (e.g., E-PROM, a floppy disk, compact disk, hard disk) is also electrically interconnected with the logic circuit 116. This memory 120 generally includes both predetermined spectral data of air and predetermined spectral data of a test gas (e.g., helium, neon, and argon). Accordingly, the logic circuit 116 is generally utilized to compare the predetermined spectral data stored in the memory 120 of the leak detection assembly 100 with the electrical signals indicative of the electromagnetic radiation 111 from the spectrometer 112/CCD array 114.

The above-described components of the leak detection assembly 100 generally enable the leak detection assembly 100 to be utilized in the following manner. As previously noted, it is generally desirable to avoid the presence of leaks in the plasma system 102 to prevent contaminants such as air from affecting the etching or deposition reactions taking place within the plasma system 102. The leak detection assembly 100 may be positioned within an optically effective distance 122 of the plasma system 102 so that the electromagnetic radiation 111 emitted from the plasma 106 may exit the plasma system 102 via the window 108 and enter the leak detection assembly 100 via the lens 110. This optically effective distance 122 may be any appropriate distance which enables collection of the electromagnetic radiation 111 from the plasma 106 without significant electromagnetic noise/interference from other sources (e.g., lights in a fabrication room) and is preferably no more than about one foot and more preferably no more than about ½ foot. Once the electromagnetic radiation 111 from the plasma 106 is collected by the spectrometer 112 and converted to an electrical signal by the CCD array 114, the electrical signal indicative of the plasma electromagnetic radiation 111 is compared to the predetermined spectral data of air stored in the memory 120 of the leak detection assembly 100. If the logic circuit 116 determines that the spectral data (in the form of the electrical signal from the CCD array 114) of the plasma 106 does not at least substantially match the predetermined spectral data of air stored in the memory 120, a determination is made that no leaks exist in the plasma system 102. Conversely, if the logic circuit 116 determines that the spectral data of the plasma 106 does at least substantially match the predetermined spectral data of air stored in the memory 120, a determination is made that one or more leaks exist in the plasma system 102. How the location of each of these leaks is determined will be discussed below.

Additional components of the leak detection assembly 100 include an appropriate power supply (e.g., AC and/or DC) 124 that is electrically interconnected with at least the spectrometer 112/CCD array 114, the memory 120, and the logic circuit 116. The leak detection assembly 100 also has a leak indicator 126. This leak indicator 126 may be one or more speakers capable of emitting audible sound, one or more lights, one more data screens (e.g., monitor or LCD screen) and/or one or more vibratory mechanisms. In this case where the leak indicator 126 is made up of one or more speakers, lights, data screens, and/or vibratory mechanisms, the leak indicator 126 may be designed to emit a first signal (audible, visual, and/or tactile) upon detection of air within the plasma system 102 and to emit a second signal (different than that of the first) upon detection of a test gas (described below) within the plasma system 102. The leak detector 100 is also equipped with a trigger 128 that may be utilized to activate leak detection operations of the leak detection assembly 100.

Figure 4:
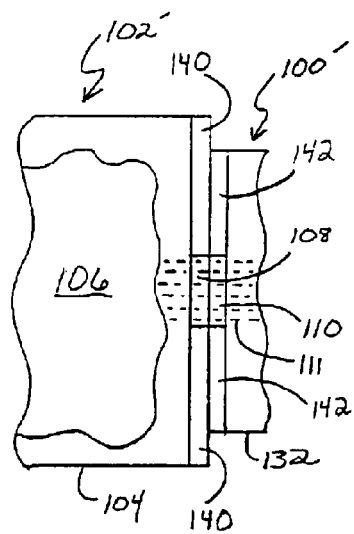
FIG. 4 is a side view of another embodiment of a leak detection assembly including a mounting structure interfacing with a mounting fixture of another embodiment of a plasma system.

Regardless of the various components included in the leak detection assembly 100, the various components of at least the embodiment shown in FIGS. 3–4 are generally substantially-contained within confines of a housing 132 of the leak detection assembly 100. In other words, in the embodiments illustrated in FIGS. 3–4, at least the spectrometer 112, the CCD array 114, the logic circuit 116, and the memory 120 are generally found within the confines of the housing 132. While the leak indicator 126, the trigger 128, the power supply 124, and a switch 130 of the leak detection assembly 100 are illustrated as being "inside" the housing 132, at least portions of these components may extend beyond the confines of the housing 132 to facilitate use of the leak detection assembly 100. For example, having the trigger 128 extend out from the housing 132 may facilitate a user being able to access the trigger 128 to activate the leak detection assembly 100. This housing 132 may be any appropriate size and shape. However, in one preferred embodiment, the leak detection assembly 100 is portable and handheld. That is, the housing 132 of this embodiment preferably has a volume (i.e., three-dimensional space enclosed within or occupied by the housing 132) of no more than about 192 in$^3$, and more preferably, no more than about 40 in$^3$. To further; quantify the handheld, portable nature of this preferred embodiment, the leak detection assembly 100 may exhibit a weight of no more than about five pounds (lbs.), and even more preferably, no more than about one pound.

FIG. 3 further illustrates another beneficial feature of the leak detection assembly 100 in that the assembly 100 includes a switch 130 to enable the leak detection assembly 100 to operate in at least first and second modes. When this switch 130 is in a first position, the logic controller 116 operates in the first mode and generally compares the predetermined spectral data of air stored in the memory of 120 of the leak detection assembly 100 with the spectral data of the plasma electromagnetic radiation 111 collected using the spectrometer 112. The leak detection assembly 100 preferably acquires only one scan (i.e., a single collection of plasma electromagnetic radiation 111) while the switch 130 is in the first position. However, the leak detection assembly 100 may be designed/configured to collect multiple scans of the plasma electromagnetic radiation 111 while the switch 130 is in the first position. When this switch is in a second position, the logic controller 116 operates in the second mode and generally compares predetermined spectral data of the test gas stored in the memory 120 with the spectral data of the plasma electromagnetic radiation 111 collected using the spectrometer 112 of the leak detection assembly 100. Unlike operation in the first mode, when the switch 130 is in the second position (i.e., when the leak detection assembly 100 is set to operate in the second mode), the leak detection assembly 100 preferably acquires a plurality of scans of the plasma electromagnetic radiation 111 for analysis using the logic circuit 116 of the leak detection assembly. These radiation acquisitions may even be collected so often as to appear substantially continuous (i.e., a scan at least every 100 $\mu$s). However, the leak detection assembly 100 may be designed/configured to enable acquisition and analysis of multiple scans at a slower rate, and even allow single scans as in the first operating mode.

This second operating mode of the leak detection assembly is generally utilized to discover the location of one or more leaks in the plasma system 102. This is generally accomplished after the leak detection assembly has been operated in the first mode, and a determination has been made that air is present in the plasma 106. In any event, the test gas (not shown) is locally applied to an external surface (e.g., a seal) of the plasma system 102, and the leak detection assembly 100 is operated in the second mode to determine if any of the test gas is entering the plasma system 102. If spectral data of the plasma electromagnetic radiation 111 includes spectral data that matches the predetermined spectral data of the test gas, a determination may be made that the leak is located where the test gas was applied to the external surface of the plasma system 102. If spectral data of the plasma electromagnetic radiation 111 does not include spectral data that matches the predetermined spectral data of the test gas, a determination may be made that the leak is not located where the test gas was applied to the external surface of the plasma system 102, and a different external surface of the plasma system 102 is selected to continue the search for the location of the leak(s).

FIG. 4 illustrates variations of both the leak detection assembly 100 and the plasma system 102 of FIG. 3. Accordingly, a single prime is utilized to distinguish the leak detection assembly 100' and the plasma system 102' of FIG. 4 from that of FIG. 3. In any event, the distinguishing features illustrated in FIG. 4 include the plasma system 102' being equipped with a mounting fixture 140 and the leak detection assembly 100' being equipped with a complimentarily designed mounting structure 142. This mounting structure 142 is configured to enable the same to be mounted on the mounting fixture 140 of the plasma system 102'. In other words, this mounting structure 142 of the leak detection assembly 100' generally allows the leak detection assembly 100' to be releasably attached to the plasma system 102'. Moreover, the mounting fixture 140 and the mounting structure 142, when engaged, allow the window 108 of the plasma system 102' to be aligned with the lens 110 of the leak detection assembly 100' to enable the plasma electromagnetic radiation 111 to exit the window 108 of the plasma system 102' and enter the leak detection assembly 100' via the lens 110. Various designs/configurations of the mounting fixture 140 and the mounting structure 142 that enable the leak detection assembly 100' to be attached to the plasma system 102' may be appropriate.

Figure 5:
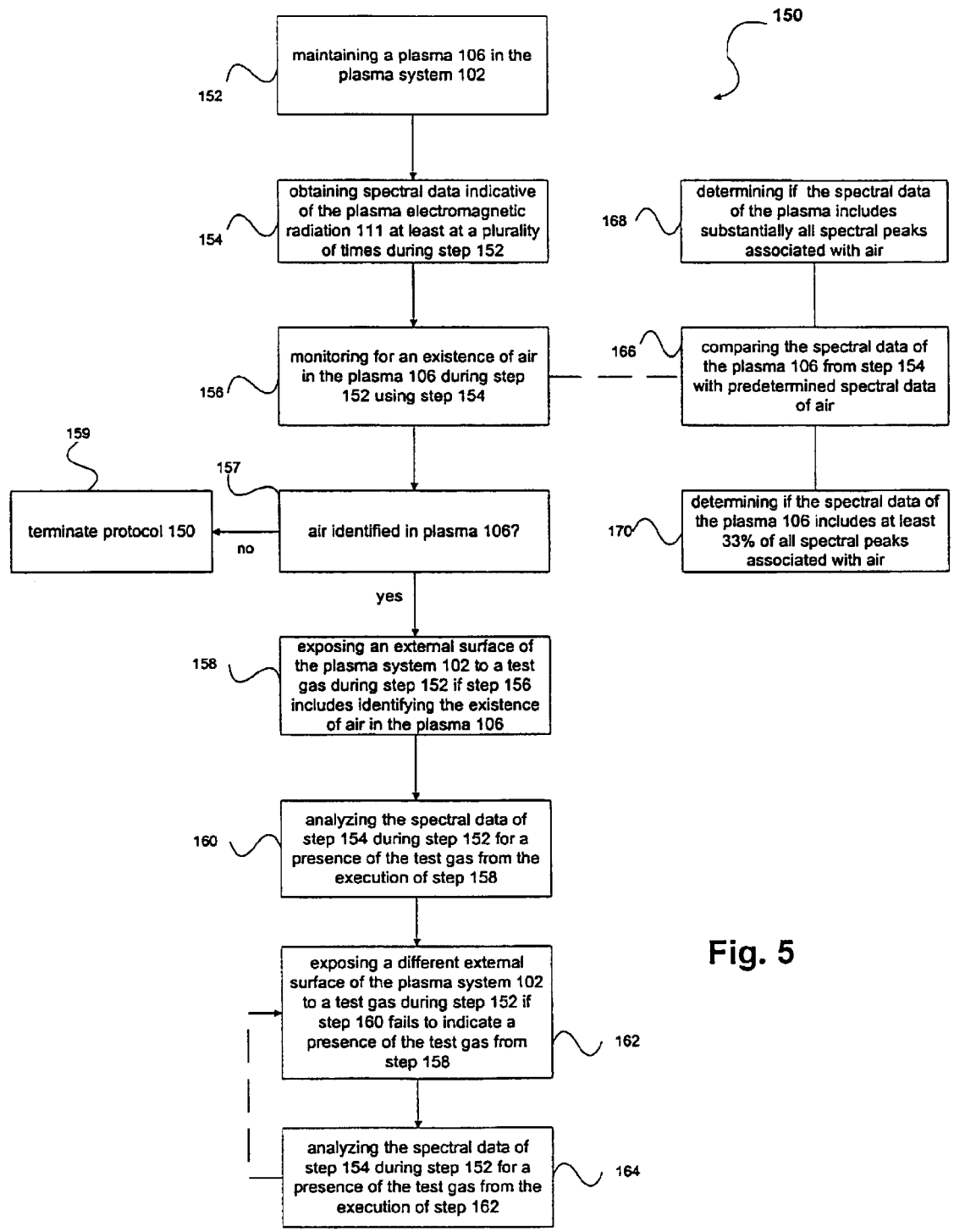
FIG. 5 is diagrammatic representation of one embodiment of a protocol for leak detection.

FIG. 5 illustrates one embodiment of a protocol 150 for detecting a leak in a plasma system (e.g., 102). While the plasma system 102 of FIG. 3 is utilized hereafter to describe the protocol 150, it should be appreciated that this protocol 150 may be utilized for any appropriate plasma system. In any event, the protocol 150 generally includes an initial step 152 of maintaining a plasma 106 in the plasma system 102 and another step 154 of obtaining spectral data indicative of the plasma electromagnetic radiation 111 at least at a plurality of times during step 152. As an additional step 156, the protocol 150 includes monitoring for an existence of air in the plasma 106 during step 152 using step 154. This monitoring step 156 may include a sub-step 166 of comparing the spectral data of the plasma 106 with predetermined spectral data of air that, for example, may be stored in the memory 120 of the leak detection assembly 100. This predetermined spectral pattern may include a plurality of, and even substantially all, wavelengths between 250 nm and 790 nm and/or may be indicative of air flowing into the plasma system 102 at a rate of greater than about 0 sccm in one embodiment and a rate of at least about 10 sccm in another embodiment. This comparison found in sub-step 166 may be achieved in a variety of appropriate fashions including determining if the spectral data obtained in step 154 includes substantially all spectral peaks associated with air (as shown in sub-step 168) or determining if the spectral data obtained in step 154 includes at least 33% of all spectral peaks associated with air (as shown in sub-step 170). Any way of determining if the spectral data from step 154 (or a portion thereof) matches the spectral data for air that is stored in the memory 120 may be utilized.

Figure 7:
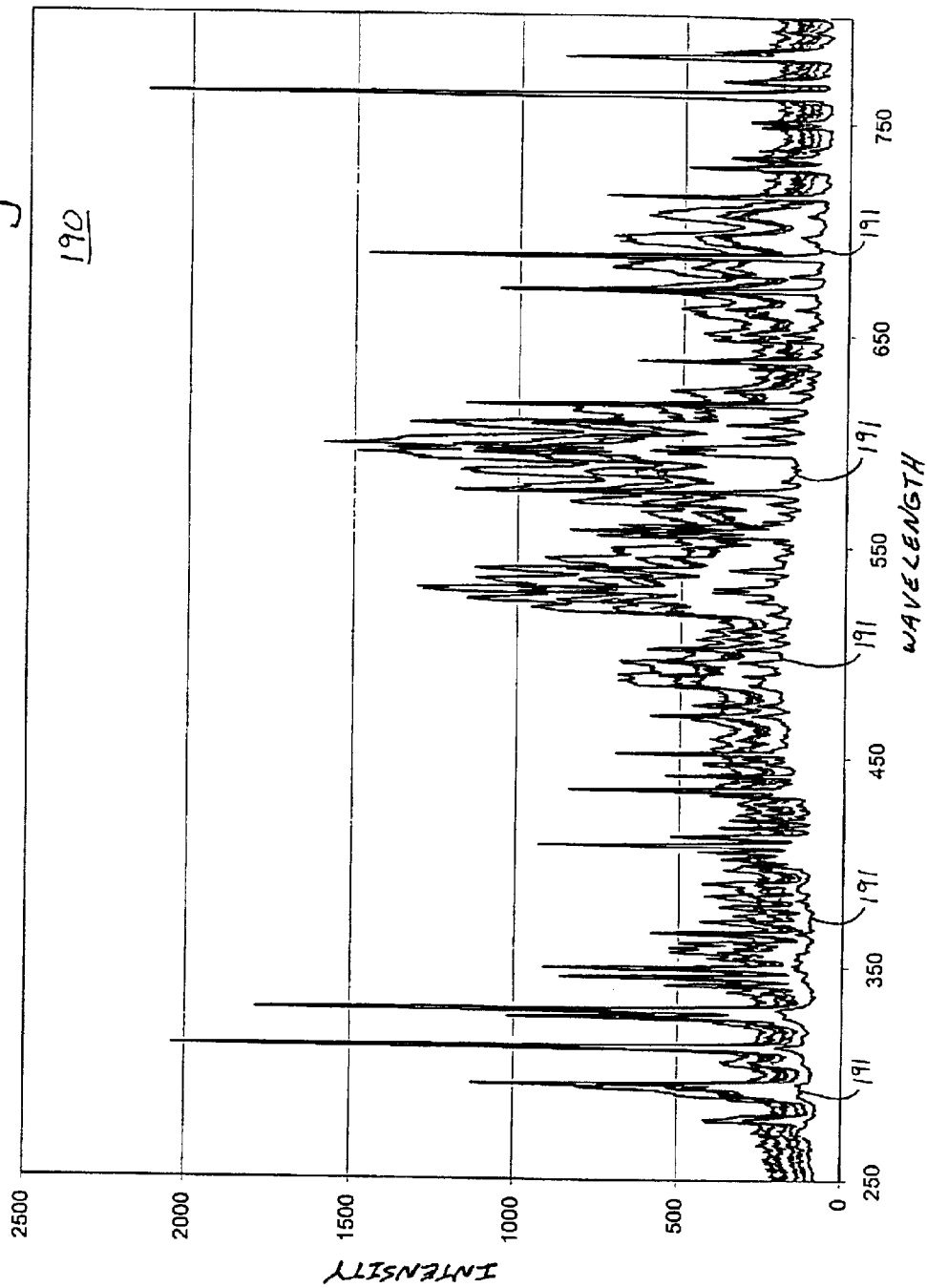
FIG. 7 is a full spectrum comparison of a plasma in a plasma system without air leaks versus seven other plasmas in particular plasma systems having leaks varying in number and magnitude.
Figure 8:
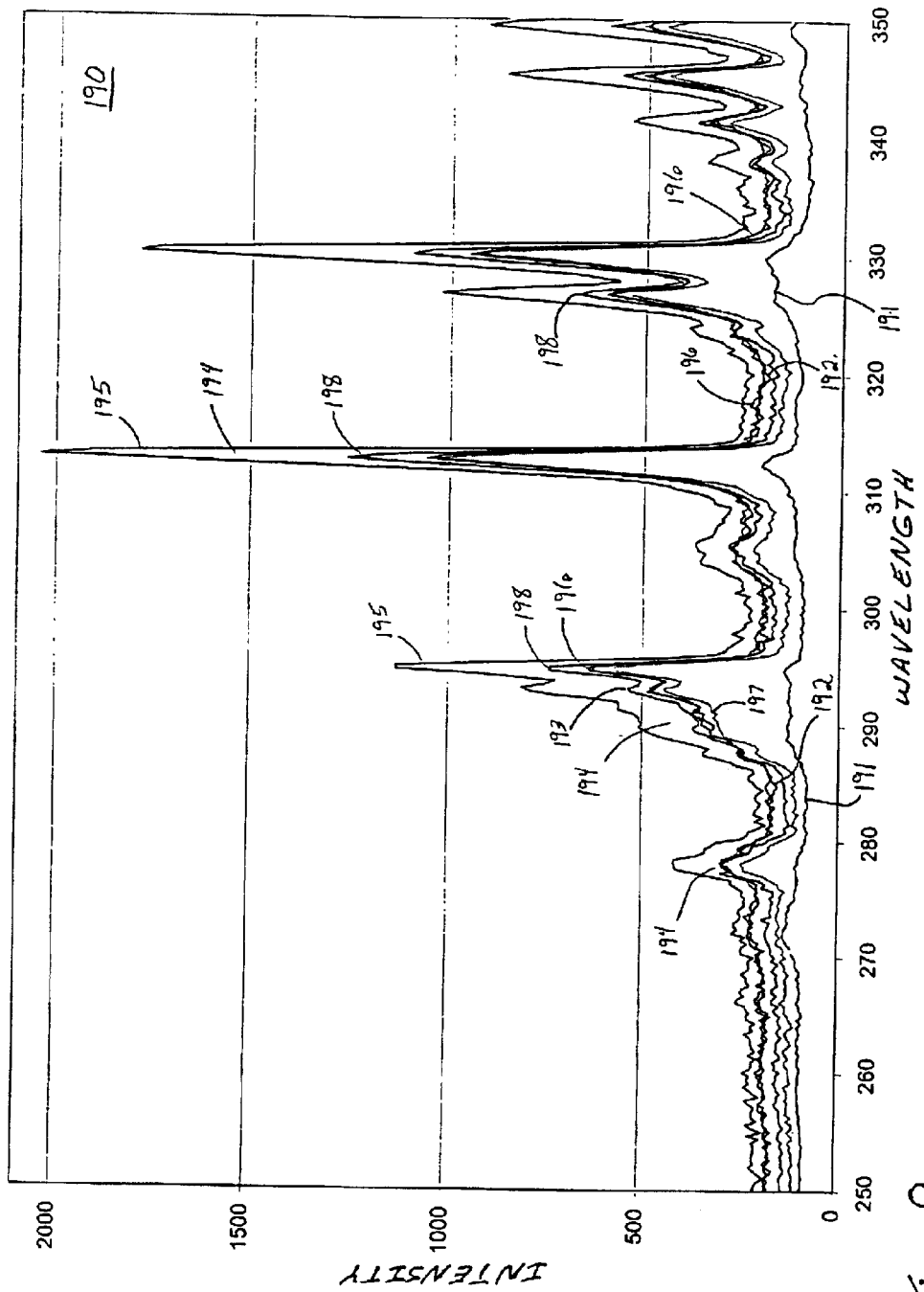
FIGS. 8–12 are magnified sections of the full spectrum comparison of FIG. 7.
Figure 9:
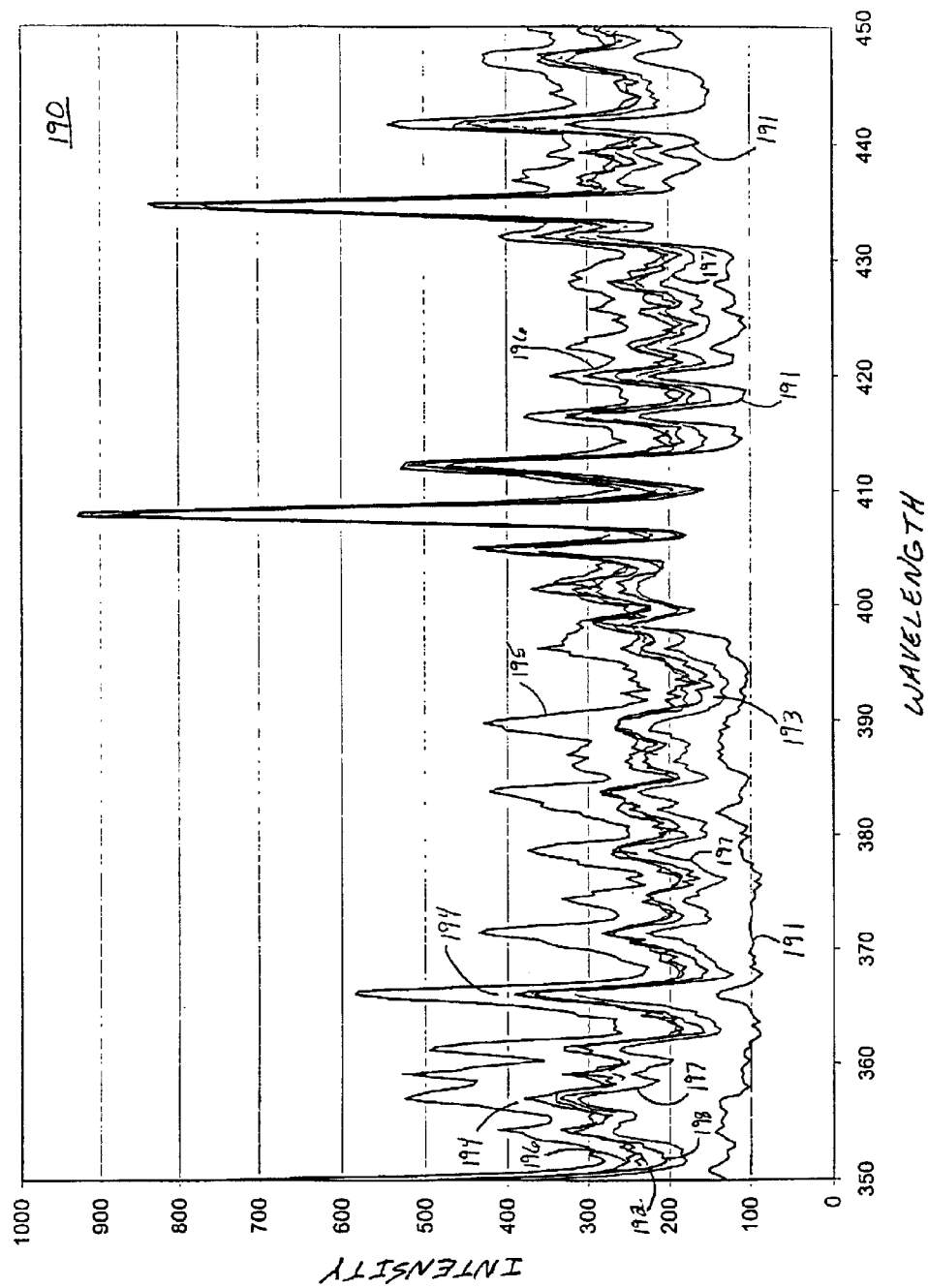
Figure 10:
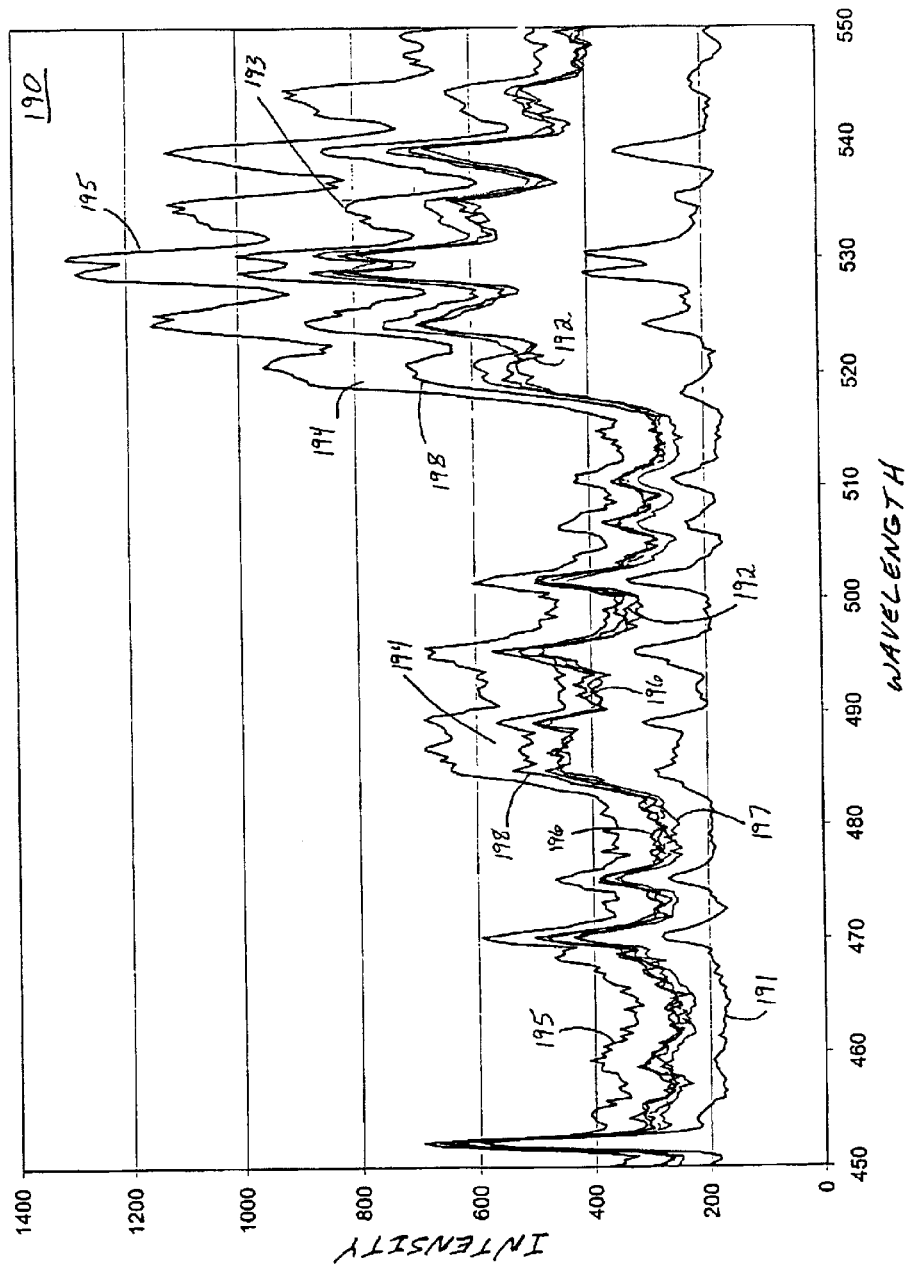
Figure 11:
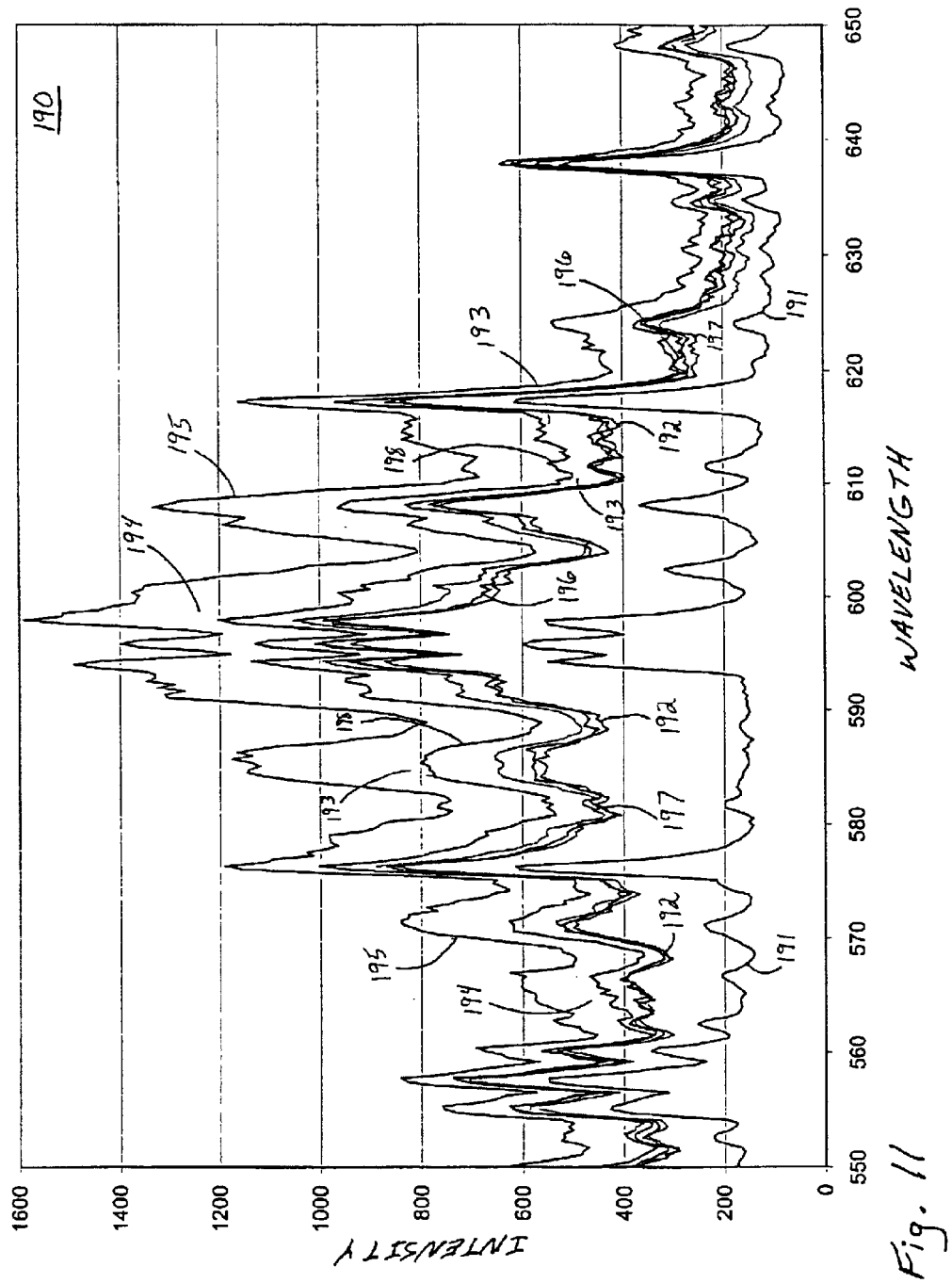
Figure 12:
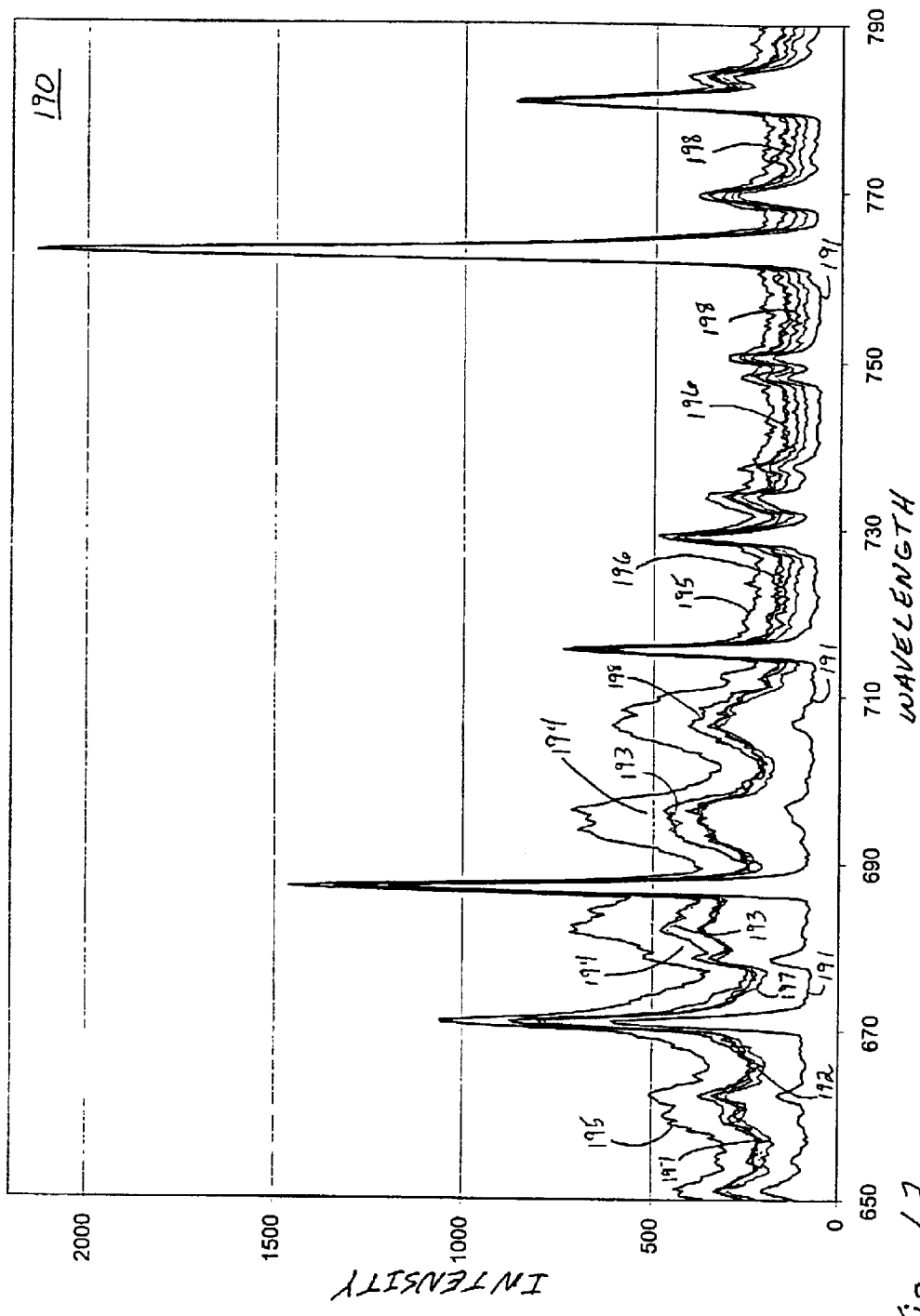

FIGS. 7–12 illustrate one way in which the comparison mentioned in sub-step 166 may be accomplished. FIG. 7 is a graph 190 illustrating the spectral patterns of a plasma contained in a plasma system without leaks (hereafter "plasma 191") versus seven other plasmas contained in plasma systems having various numbers of leaks in various magnitudes (hereafter "plasmas 192–198"). FIGS. 8–12 are merely magnified sections of FIG. 7 to further illustrate the variation between the spectral pattern of plasma 191 that is substantially devoid of air versus the spectral patterns of plasmas 192–198 that have varying magnitudes of air therein. Referring specifically to FIG. 7, the plasma 191 (free of air leaks) has a significantly different spectral pattern to the other plasmas represented on the graph 190. This comparison shown in the graph 190 of FIGS. 7–12 illustrates that the difference between the plasma 191 (free of leaks) and the other plasmas 192–198 is not just a comparison of a particular spectral peak or two at a given wavelength, but a comparison across an entire range of wavelengths (in this case, about 250 nm up to about 790 nm). This broad range comparison is done because mere detection of particular peaks associated with certain elements (e.g., oxygen and/or nitrogen) within the plasma may give "false positives" regarding air leaks. That is, since one or more elemental components of air may be components of a feed gas or element being released within the plasma system 102 due to normal plasma processing operations, detection of only an element or two may result in a determination that a leak is present when, in all reality, one is not. Thus, a comparison of the plasma 191 to that of a substantially entire spectrum range of air generally results in avoiding such "false positives." Table 1 below indicates the number of leaks and size (in standard cubic centimeters or "seem") of each leak associated with each plasma 192–198 illustrated in the graph 190 of FIGS. 7–12.

TABLE 1

| Reference No. | Number of Leaks | Size of Each Leak (sccm) |
|---|---|---|
| 192 | 1 | 10 |
| 193 | 1 | 15 |
| 194 | 1 | 20 |
| 195 | 1 | 25 |
| 196 | 2 | 10 |
| 197 | 1 | 12 |
| 198 | 2 | 15 |

As the graph 190 indicates, the plasmas 192–198 (having air leaks present) show significant spectral differences to that of the plasma 191 (having no leaks). Moreover, these spectral differences generally become more dramatic/prominent as the rate and/or number of leaks increases.

Referring back to the protocol 150 of FIG. 5, a decision is made at step 157 with regard to the monitoring of step 156. If air is not detected in the plasma 106, the protocol 150 proceeds from step 157 to step 159 where the protocol 150 terminated. However, if air is identified in the plasma 106 by the monitoring of step 156, the protocol 150 proceeds from step 157 to a step 158 of exposing a first external surface of the plasma system 102 to a test gas during step 152. Yet another step 160 in the protocol 150 includes analyzing the spectral data of the plasma 106 from step 154 during step 152 for a presence of the test gas from the execution of step 158. This analyzing step 160 may include comparing the spectral data of the plasma 106 obtained in step 154 with predetermined spectral data of the test gas that, for example, may be stored in the memory 120 of the leak detection assembly 100. This predetermined spectral pattern of the test gas may include one or more spectral peaks at defined wavelengths or may be one or more ranges of wavelengths (e.g., between 250 nm and 800 nm). This comparison utilized in the analyzing step 160 may be achieved in a variety of appropriate fashions including determining if the spectral data obtained in step 154 includes the spectral peaks associated with the test gas. Any way of determining if the spectral data from step 154 (or a portion thereof) matches the spectral data for the test gas that is stored in the memory 120 maybe utilized. Accordingly, this step 160 (in combination with step 158) generally either confirms or disaffirms the presence of a leak at the location of the first external surface to which the test gas was exposed.

Two optional steps may be included in the protocol 150 if step 160 does not result in finding the location of the leak(s). The first optional step 162 may be characterized as a sort of "repeat" of step 158 in a different location. That is, step 162 generally includes exposing a different external surface of the plasma system 102 to the test gas during step 152. In other words, if the test gas is not detected within the plasma system 102 after exposing the external surface mentioned in step 158 to the test gas, the protocol 150 may include exposing another external surface of the plasma system 102 to the test gas. Upon execution of step 162, the protocol may once again include another analyzing step 164 wherein the spectral data of step 154 is once again analyzed to determine if the test gas is present therein. These additional exposing and analyzing steps 162, 164 may be repeated as many times as necessary to determine the location of all leaks present in the plasma system 102. The protocol 150 could be configured to terminate a leak. However, it may be desirable to check all seals in accordance with the protocol 150 of FIG. 5 since there, of course, may be more than one leak location. As previously mentioned, any product (e.g., a wafer or chip precursor) originally disposed within the plasma system 102 may or may not be removed during the protocol 150.

Figure 6:
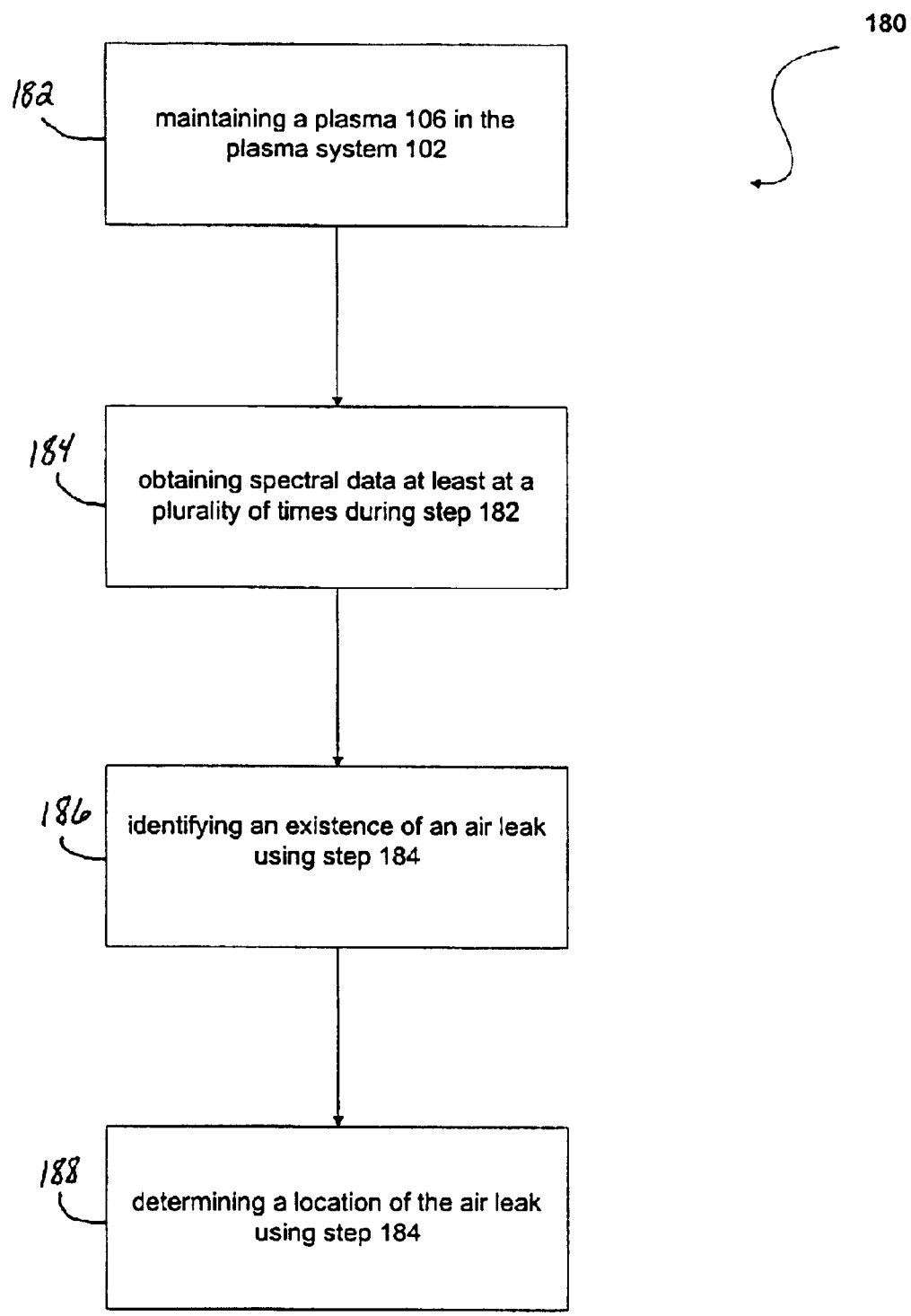
FIG. 6 is diagrammatic representation of another embodiment of a protocol for leak detection.

FIG. 6 illustrates another embodiment of a protocol 180 for detecting a leak in a plasma system (e.g., 102). As with the description of FIG. 5, while the plasma system 102 of FIG. 3 is utilized hereafter to describe the protocol 180, it should be appreciated that this protocol 180 may be utilized for any appropriate plasma system. In any event, the protocol 180 generally includes an initial step 182 of maintaining the plasma 106 in the plasma system 102 and another step 184 of obtaining spectral data at least at a plurality of times during step 182. The protocol 180 includes yet another step 186 of identifying an existence of an air leak using step 184 and still another step 188 of determining a location of the air leak using step 184. Thus, both steps 186 and 188 of the protocol are conducted during step 182. Both of the above-mentioned protocols 150, 180 may be accomplished utilizing the leak detection assembly 100 of FIG. 3.

Those skilled in the art will now see that certain modifications can be made to the assembly and methods herein disclosed with respect to the illustrated embodiments, without departing from the spirit of the instant invention. And while the invention has been described above with respect to the preferred embodiments, it will be understood that the invention is adapted to numerous rearrangements, modifications, and alterations, and all such arrangements, modifications, and alterations are intended to be within the scope of the appended claims.

What is claimed:

1. A method of detecting a leak in a plasma system, the method comprising the steps of:
    maintaining a plasma in said plasma system;
    obtaining optical emissions spectral data of said plasma at least a plurality of times during said maintaining step;
    monitoring for an existence of air in said plasma system during said maintaining step and using said obtaining step;
    exposing an external surface of said plasma system to a test gas if said monitoring step includes identifying the existence of air in said plasma system, wherein said exposing step is executed during said maintaining step; and
    analyzing said optical emissions spectral data of said obtaining step for a presence of said test gas from an execution of said exposing step and during said maintaining step.

2. A method, as claimed in claim 1, wherein said monitoring step comprises comparing said optical emissions spectral data of said plasma from said obtaining step with predetermined optical emissions spectral data of air.

3. A method, as claimed in claim 1, wherein said monitoring step comprises acquiring optical emissions spectral data indicative of air and storing said optical emissions spectral data indicative of air on a computer-readable storage medium.

4. A method, as claimed in claim 1, further comprising the step repeating said exposing and analyzing steps for a different said external surface if said presence of said test gas is not identified from said analyzing step.

5. A method, as claimed in claim 1, further comprising utilizing a handheld, portable device to execute each of said obtaining step, said monitoring step, and said analyzing step.

6. A method, as claimed in claim 5, wherein said obtaining step comprises pointing said handheld, portable device at a window of said plasma system.

7. A method, as claimed in claim 1, further comprising the step of removing any product from said plasma system before executing said exposing step.

8. A method, as claimed in claim 1, further comprising the steps of providing product to said plasma system and running a first plasma process on said product using said maintaining step.

9. A method, as claimed in claim 1, wherein said monitoring step is executed by a leak detector operating in a first mode, and wherein said analyzing step is executed by said leak detector operating in a second mode that is different from said first mode.

10. A method, as claimed in claim 1, wherein said monitoring step comprises having a switch on a handheld leak detector in a first position, wherein said analyzing step comprises having said switch on said handheld leak detector in a second position, wherein said first position requires said handheld leak detector to compare said optical emissions spectral data of said plasma with a spectral pattern of air stored on said handheld leak detector, and wherein said second position requires said handheld leak detector to compare said optical emissions spectral data of said plasma with a spectral pattern of said test gas stored on said handheld leak detector.

11. A method, as claimed in claim 1, wherein said monitoring step comprises using a leak detector for comparing said optical emissions spectral data of said plasma spectral data of air stored on said leak detector, and wherein said analyzing step comprises using said leak detector for comparing said optical emissions spectral data of said plasma with spectral data of said test gas stored on said leak detector.

12. A method of detecting a leak in a plasma system, the method comprising the steps of:
    maintaining a plasma in said plasma system;
    obtaining optical emissions spectral data of said plasma at least Ma plurality of times during said maintaining step;
    comparing said optical emissions spectral data from said obtaining step with a predetermined spectral pattern indicative of optical emissions spectral data of air;
    exposing an external seal of said plasma system to a test gas if said comparing step determines that said optical emissions spectral data of said plasma includes a pattern that matches said predetermined spectral pattern, wherein said exposing step occurs during said maintaining step; and
    analyzing said optical emissions spectral data from said obtaining step for a presence of said test gas from an execution of said exposing step.

13. A method, as claimed in claim 12, wherein said comparing step comprises determining if said optical emissions spectral data of said plasma includes each spectral peak associated with air.

14. A method, as claimed in claim 12, wherein said comparing step comprises determining if said optical emissions spectral data of said plasma includes at least 33% of all spectral peaks associated with air.

15. A method, as claimed in claim 12, further comprising the step of repeating said exposing and analyzing steps for a different said external seal if said analyzing step fails to determine that said optical emissions spectral data of said plasma indicates said presence of said test gas.

16. A method, as claimed in claim 12, further comprising utilizing a handheld, portable device for said obtaining step, said comparing step, and said analyzing step.

17. A method, as claimed in claim 12, further comprising the step of removing any product from said plasma system before executing said exposing step.

18. A method, as claimed in claim 12, further comprising the steps of providing product to said plasma system and running a first plasma process on said product using said maintaining step.

19. A method, as claimed in claim 12, wherein said test gas is selected from the group consisting of helium, neon, and argon.

20. A method, as claimed in claim 12, wherein said predetermined spectral pattern comprises a plurality of wavelengths between 250 nm and 790 nm.

21. A method, as claimed in claim 12, wherein said predetermined spectral pattern consists essentially of substantially all wavelengths between 250 nm and 790 nm.

22. A method, as claimed in claim 12, wherein said predetermined spectral pattern is indicative of air flowing into said plasma system at a rate of greater than about 0 sccm.

23. A method, as claimed in claim 12, wherein said predetermined spectral pattern is indicative of air flowing into said plasma system at a rate of at least about 10 sccm.

24. A method of detecting a leak in a plasma system, the method comprising the steps of:

maintaining a plasma in said plasma system;

obtaining optical emissions spectral data at least a plurality of times during said maintaining step;

identifying an existence of an air leak from said obtaining step; and determining a location of said air leak from said obtaining step.

25. A leak detection assembly for use in combination with a plasma system, wherein said leak detection assembly comprises:

a spectrometer;

a memory comprising optical emissions data of air and optical emissions data of a test gas;

a logic circuit capable of comparing optical emissions data obtained from said plasma system by said spectrometer with at least one of said optical emissions data of air and said optical emissions data of said test gas; and a switch, wherein when said switch is in a first position, said logic circuit is capable of comparing said optical emissions data of air with said optical emissions data obtained from the plasma system by said spectrometer, and wherein when said switch is in a second position, said logic circuit is capable of comparing said optical emissions data of said test gas with said optical emissions data obtained from the plasma system by said spectrometer.

26. A leak detection assembly, as claimed in claim 25, further comprising a housing, wherein said spectrometer, said memory, and said logic circuit are substantially disposed within said housing, and wherein said housing comprises a volume of no more than about 192 in$^3$.

27. A leak detection assembly, as claimed in claim 25, wherein said leak detection assembly weighs no more than about five pounds (lbs.).

28. A leak detection assembly, as claimed in claim 25, wherein said leak detection assembly is a handheld device.

29. A leak detection assembly, as claimed in claim 25, further comprising a means for providing a indication that said leak detection assembly has detected at least one of air and said test gas within the plasma system.

30. A leak detection assembly, as claimed in claim 29, wherein said means comprises one or more of alarms, lights, vibratory mechanisms, and combinations thereof.

31. A leak detection assembly, as claimed in claim 25, further comprising a trigger, wherein activation of said trigger of said leak detection assembly initiates collection and analysis of said optical emissions data.

32. A leak detection assembly, as claimed in claim 25, further comprising a mounting structure, wherein said mounting structure is configured so as to enable said leak detection assembly to be mountable on the plasma system.

33. A leak detection assembly for use in combination with a plasma system, wherein said leak detection assembly comprises:

means for collecting optical emissions data of a plasma;

a memory comprising optical emissions data of air and optical emissions data of a leak detection gas; and means for comparing said optical emissions data of said plasma with both said optical emissions data of air and said optical emissions data of said leak detection gas.

* * * * *

UNITED STATES PATENT AND TRADEMARK OFFICE
CERTIFICATE OF CORRECTION

PATENT NO. : 6,769,288 B2
DATED : August 3, 2004
INVENTOR(S) : Ward et al.

It is certified that error appears in the above-identified patent and that said Letters Patent is hereby corrected as shown below:

Column 14,
Line 16, delete "Ma", and insert therefor -- a --.

Signed and Sealed this

Thirtieth Day of November, 2004

JON W. DUDAS
*Director of the United States Patent and Trademark Office*